(12) United States Patent
Eun

(10) Patent No.: US 10,765,004 B2
(45) Date of Patent: Sep. 1, 2020

(54) MAINBOARD FOR POS TERMINAL

(71) Applicant: Dong Uk Eun, Gwangmyeong-Si (KR)

(72) Inventor: Dong Uk Eun, Gwangmyeong-Si (KR)

(73) Assignee: POSBANK CO., LTD., Seoul (KR)

( * ) Notice: Subject to any disclaimer, the term of this patent is extended or adjusted under 35 U.S.C. 154(b) by 0 days.

(21) Appl. No.: 16/483,193

(22) PCT Filed: Jan. 10, 2018

(86) PCT No.: PCT/KR2018/000472
§ 371 (c)(1),
(2) Date: Aug. 2, 2019

(87) PCT Pub. No.: WO2018/143575
PCT Pub. Date: Aug. 9, 2018

(65) Prior Publication Data
US 2019/0380205 A1 Dec. 12, 2019

(30) Foreign Application Priority Data

Feb. 3, 2017 (KR) .................. 10-2017-0015588

(51) Int. Cl.
*H01R 12/00* (2006.01)
*H05K 1/18* (2006.01)
(Continued)

(52) U.S. Cl.
CPC ........... *H05K 1/18* (2013.01); *H01R 12/7082* (2013.01); *H01R 13/631* (2013.01);
(Continued)

(58) Field of Classification Search
CPC .. H01R 13/508; H01R 12/716; G07G 1/0018; F16M 11/10; G06F 1/16
(Continued)

(56) References Cited

U.S. PATENT DOCUMENTS 5,594,920 A * 1/1997 Ebina .................. G06F 1/16
705/24
7,837,104 B2 * 11/2010 Lum .................... F16M 11/10
235/379

(Continued)

FOREIGN PATENT DOCUMENTS

JP 2007-008020 A 1/2007
KR 20-0325661 Y1 9/2003
(Continued)

OTHER PUBLICATIONS

Posbank, 'APEXA G Product Mannual' [online], Jul. 2, 2016, [Retrieved on Jan. 22, 2018], Internet: <URL: https://www.posbank.co.kr/customer-service/data_board.php?NID=634&N_FID=3&mode=view>, p. 1-80. see p. 8.

Primary Examiner — Jean F Duverne
(74) Attorney, Agent, or Firm — John K. Park; Park Law Firm

(57) ABSTRACT

The present invention has advantages in that as a USB port unit and a hard disk port unit are formed on the edge of the substrate unit thereby allowing external USB and external disks to be directly connected to the main board, so that it prevents electrical malfunction caused by cable connection, and as the transmission speed of high-speed communication increases through direct connection, it is to provide a main board for POS terminal which may maintain stable system by reducing communication errors.

2 Claims, 8 Drawing Sheets

(51) Int. Cl.
*H01R 12/70* (2011.01)
*H01R 13/631* (2006.01)
*H05K 7/14* (2006.01)

(52) U.S. Cl.
CPC . *H05K 7/1454* (2013.01); *H05K 2201/09027* (2013.01); *H05K 2201/10189* (2013.01); *H05K 2201/10446* (2013.01); *H05K 2201/10454* (2013.01)

(58) Field of Classification Search
USPC .......................................................... 439/55
See application file for complete search history.

(56) References Cited

U.S. PATENT DOCUMENTS

| | | | | |
|---|---|---|---|---|
| 8,800,872 B2 * | 8/2014 | Herring | ................ | G07G 1/0018 235/449 |
| 2007/0241184 A1 * | 10/2007 | Lum | .................... | G07G 1/0018 235/380 |

FOREIGN PATENT DOCUMENTS

| | | |
|---|---|---|
| KR | 10-2004-0104943 A | 12/2004 |
| KR | 10-2006-0075493 A | 7/2006 |
| TW | M422093 U1 | 2/2012 |

* cited by examiner

MAINBOARD FOR POS TERMINAL

TECHNICAL FIELD

The present invention relates to a main board for POS terminal, and relates to a main board for POS terminal including a substrate unit 110 and a one-stage port module unit 120 formed on the front-side upper part of the substrate unit 110 and having a plurality of ports in one-stage arrangement in relation to a main board for POS terminal 100 built in a POS terminal (not shown).

BACKGROUND ART

Generally, a Point Of Sale (POS) terminal is a terminal for managing a point-of-sale, and it is necessary to build a POS system, which is a system that uses a computer to manage sales related data at the time of sale.

Here, the POS system is a system that reflects the purchase and production of goods and is applied to detailed sales management after inputting the sales information generated by each product simultaneously with sales and then using this information through a configuration that connects a POS terminal installed in a store such as a retail store selling products and a main server that is a host computer.

These POS systems are a very useful system of sales time point management, and are rapidly becoming popular in various industrial fields in recent years.

Meanwhile, the POS system includes a POS terminal that functions as a cash register, and a main server connected to the POS terminal and collecting/storing/aggregating/analyzing data transmitted from the POS terminal.

Among them, a main board that sets the execution environment of the POS terminal, maintains the information, stably drives the POS terminal, and is electrically connected to the peripheral devices to facilitate data input/output exchange is inside the POS terminal.

In relation to such existing main boards, as shown in FIG. 1 or FIG. 2, an old-fashioned substrate 11 of a rectangular shape is formed, and a CPU chipset unit in which a central processing unit (CPU) is mounted on the upper portion of the old-fashioned substrate 11, a memory slot unit in which a random access memory (RAM) is mounted, a USB connector 13 to which a separate USB cable is connected, and an external disk connector 14 to which a separate disk cable is connected are formed, and a multi-stage port module 12 in which various ports such as output port, PS2Combo port, LAN port, audio port, input port, HDMI/DISPLAY port 1.2, SATA port, USB DAC-UP port, WIFI/BT3.0/4.0 are arranged in two or more stages on the front surface of the old-fashioned substrate 11.

However, since the conventional main board has a structure in which the external USB and external disk are electrically connected to the main board by using a separate USB cable and a separate disk cable, if the cable is bad or damaged, an electrical malfunction may occur due to a connection failure, resulting in a fatal defect in the POS system, and communication errors frequently occur as the transmission speed with external devices performing high-speed communication becomes slow so that there is a problem that it is difficult to maintain a stable system.

Also, as the thickness of the POS terminal is increased due to the structure of the multi-stage port module 12 of two or more stages, it is restricted by installation space so that there are problems that the POS terminal may not be installed on a desk, a small-sized table, a counter, a counter desk, and the like and the space is small and inconvenience is caused even if it is installed.

DISCLOSURE OF THE INVENTION

Technical Problem

The present invention has been suggested to solve the above-mentioned problems, and the object of the present invention is to provide a main board for POS terminal, which may easily install and use a POS terminal on a desk, a small-sized table, a counter, a counter desk, and the like without the limitation of an installation space, as a stage port module unit of one-stage arrangement is formed by removing unnecessary ports from the existing multi-stage port module of two or more stages to form the thickness of the POS terminal to be thinner than the existing one.

In addition, as a USB port unit and a hard disk port unit are formed on the edge of the substrate unit thereby allowing external USB and external disks to be directly connected to the main board, so that it prevents electrical malfunction caused by cable connection, and as the transmission speed of high-speed communication increases through direct connection, it is to provide a main board for POS terminal which may maintain stable system by reducing communication errors.

Technical Solution

In order to solve the above problems, in a main board for POS terminal 100 built in a POS terminal (not shown), the main board for POS terminal includes: a substrate unit 110; and a one-stage port module unit 120 formed on a front side upper part of the substrate unit 110 and having a plurality of ports for connecting peripheral devices in one-stage arrangement, In addition, a USB port unit 130 installed in a vertical direction may be further formed on a rear side upper part of the substrate unit 110.

In addition, an extended substrate unit 111 protruding outward may be extended and formed on one side of the substrate unit 110, and a hard disk port unit 140 installed in a horizontal direction may be further formed on a front side upper part of the extended substrate unit 111.

In addition, rail block units 150 and 150' for guiding a horizontal movement of the hard disk 200 and fixing the hard disk 200 when the hard disk 200 is coupled to the hard disk port unit 140 may be respectively formed on both sides of a front surface of the extended substrate unit 111 in a process of connecting the hard disk 200 to the hard disk port unit 140.

In addition, in each of the rail block units 150 and 150', moving paths 151 and 151' in which parts of both sides M and M' of the hard disk 200 are inserted may be formed on an inner side, and a plurality of first engaging protrusions 152 and 152' may be formed on inner sides of the moving paths 151 and 151', and a plurality of second engaging protrusions 153a and 153a' may be provided in the moving paths 151 and 151' and may be formed on one sides thereof, and pressing bar members 153 and 153' where round contact surfaces 153b and 153b' are bent in inner directions of the moving paths 151 and 151' may be provided on the end part, and elastic members 154 and 154' in a tension state may be provided between the first engaging protrusions 152 and 152' and the second engaging protrusions 153a and 153a'.

Advantageous Effects

As described above, according to the present invention, there are advantages that a main board for POS terminal may easily install and use a POS terminal on a desk, a small-sized table, a counter, a counter desk, and the like without the limitation of an installation space, as a stage port module unit of one-stage arrangement is formed by removing unnecessary ports from the existing multi-stage port module of two or more stages to form the thickness of the POS terminal to be thinner than the existing one.

In addition, there are advantages that as a USB port unit and a hard disk port unit are formed on the edge of the substrate unit thereby allowing external USB and external disks to be directly connected to the main board, so that it prevents electrical malfunction caused by cable connection, and as the transmission speed of high-speed communication increases through direct connection, it is to provide a main board for POS terminal which may maintain stable system by reducing communication errors.

MODE FOR CARRYING OUT THE INVENTION

Figure 1:
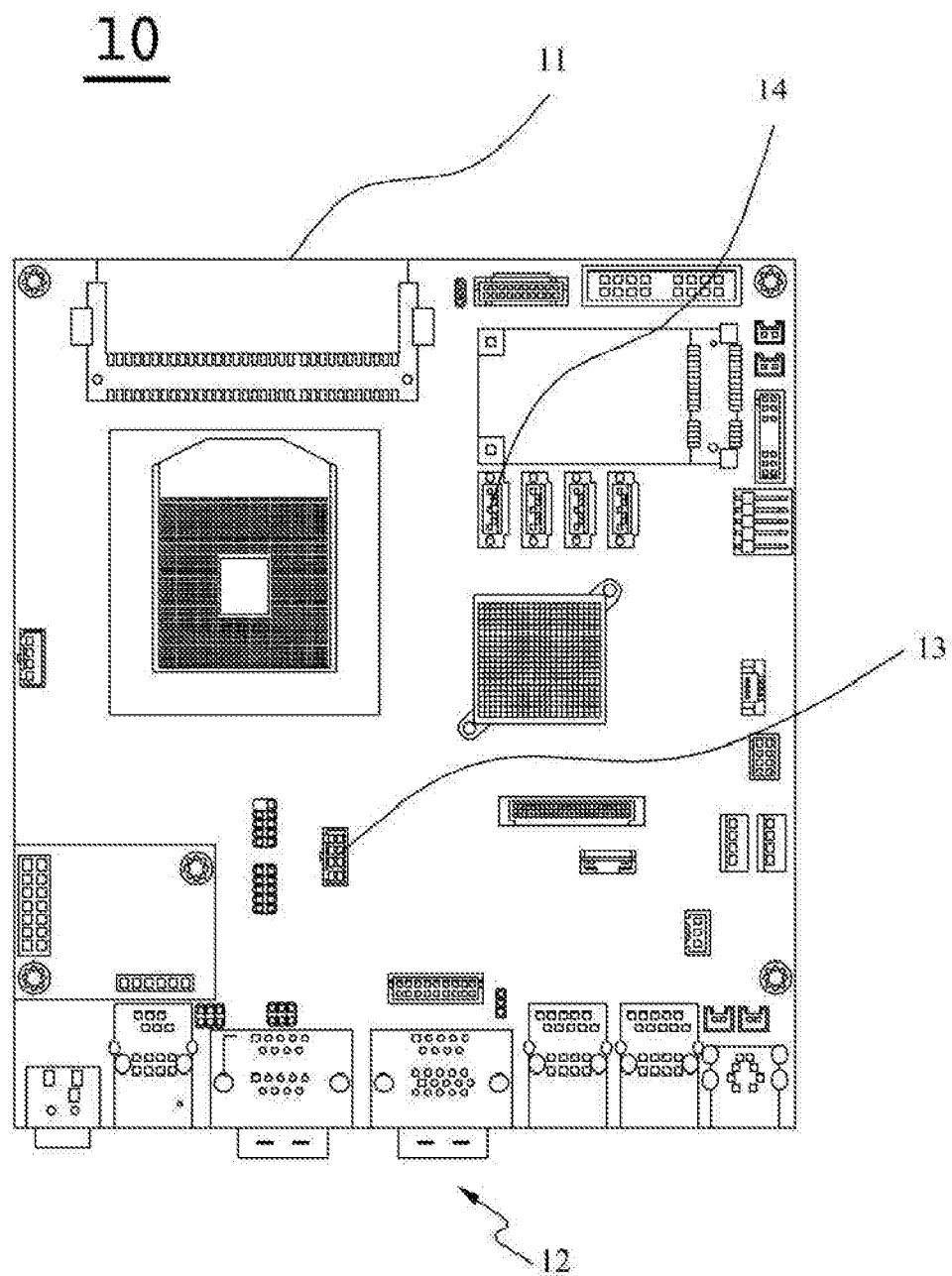
FIG. 1 is a plan view showing a top view of a main board used in an existing POS terminal.
Figure 2:
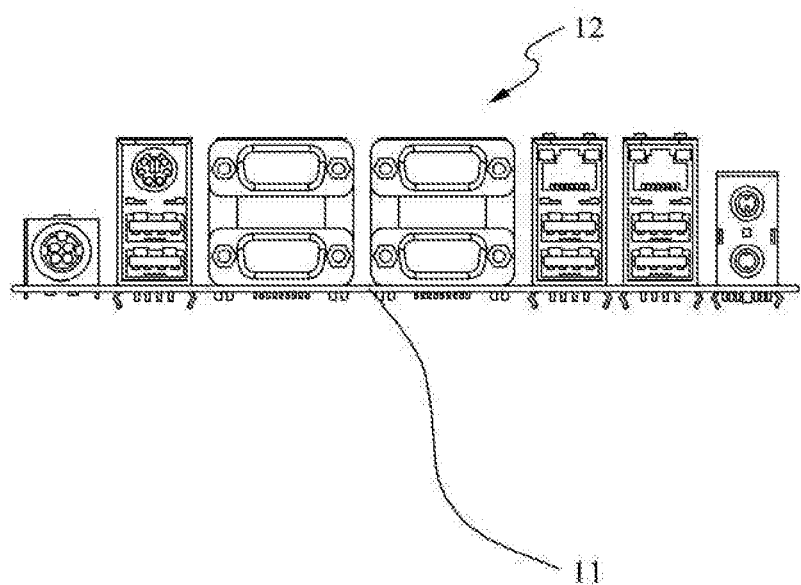
FIG. 2 is a front view showing a front view of a main board used in an existing POS terminal.

Hereinafter, a main board for POS terminal 100 according to an embodiment of the present invention will be described in detail with reference to the accompanying drawings. First, in the drawings, it should be aware that the same components or parts are denoted by the same reference numerals whenever possible. In describing the present invention, a detailed description of related known functions and configurations will be omitted so as not to obscure the subject matter of the present invention.

Figure 3:
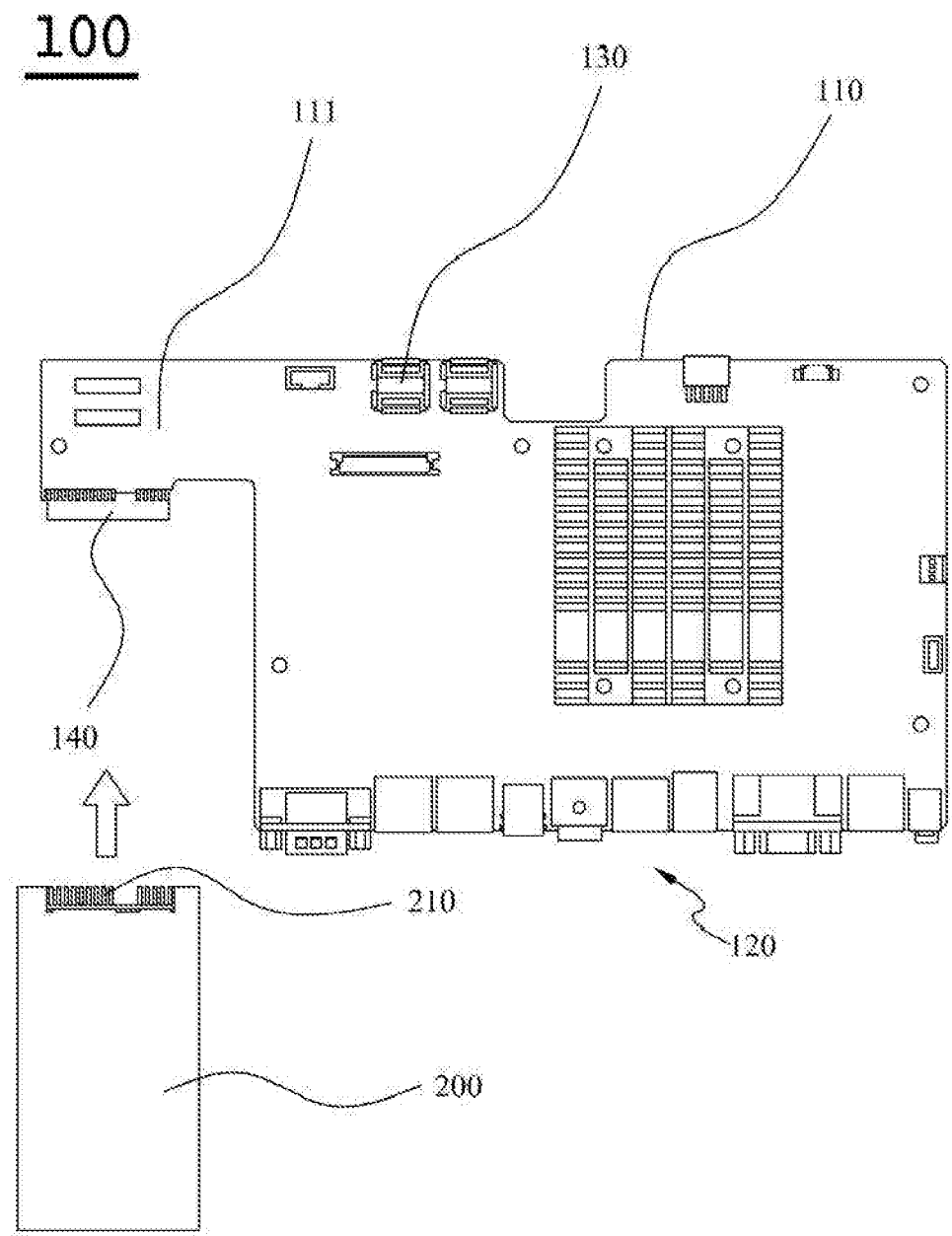
FIG. 3 is a plan view showing a top view of a main board for POS terminal according to a preferred embodiment of the present invention.
Figure 4:
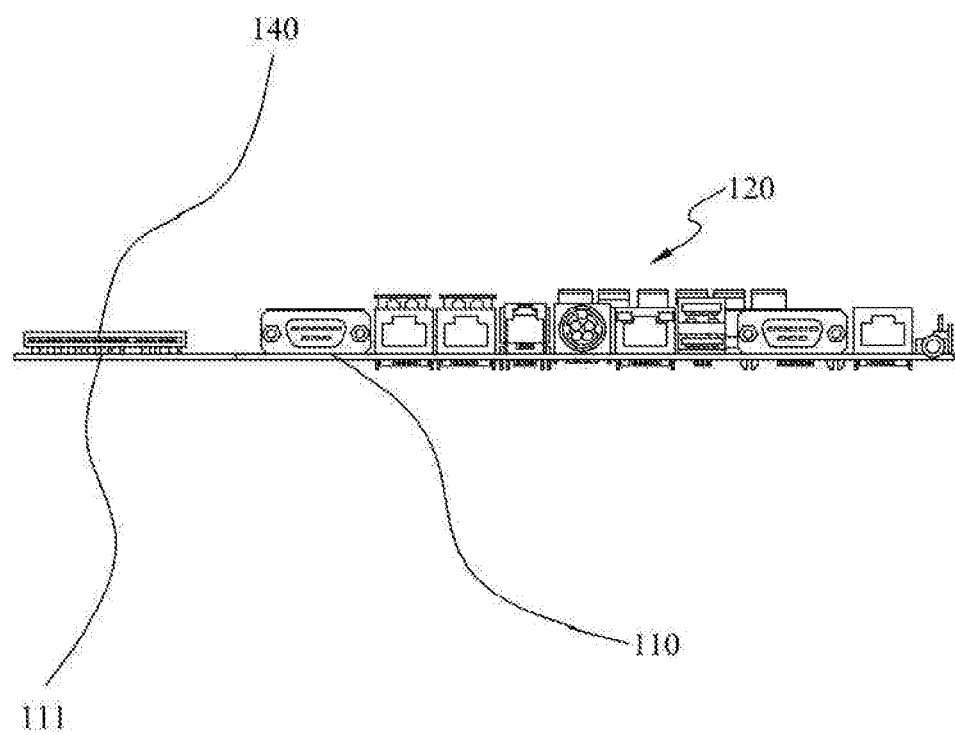
FIG. 4 is a front view showing a front view of a main board for POS terminal according to a preferred embodiment of the present invention.
Figure 5:
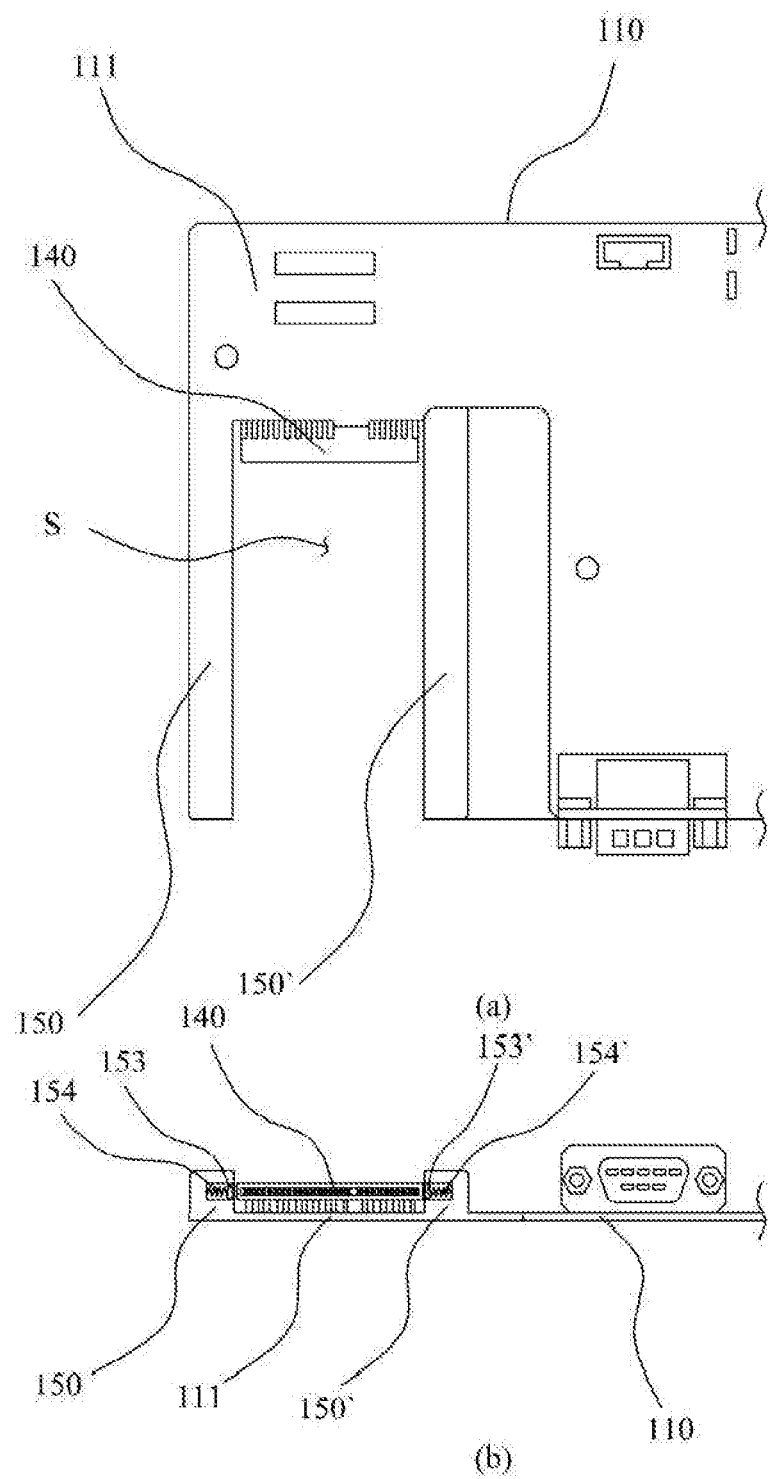
FIG. 5 is a plan view and a front view of a main board for POS terminal according to another preferred embodiment of the present invention.
Figure 6:
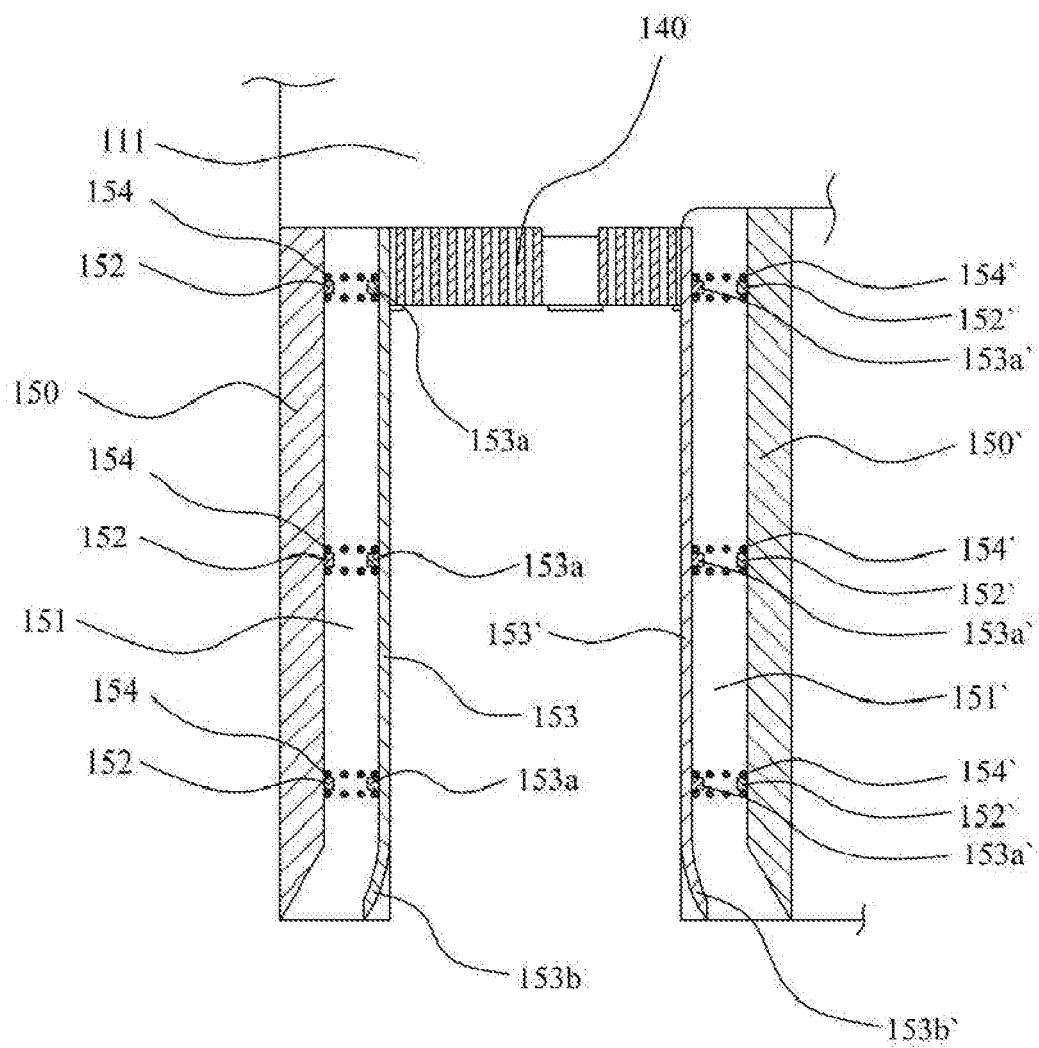
FIG. 6 is a cross-sectional view showing a cross-section of a rail block unit in the configuration of a main board for POS terminal according to a preferred embodiment of the present invention.
Figure 7:
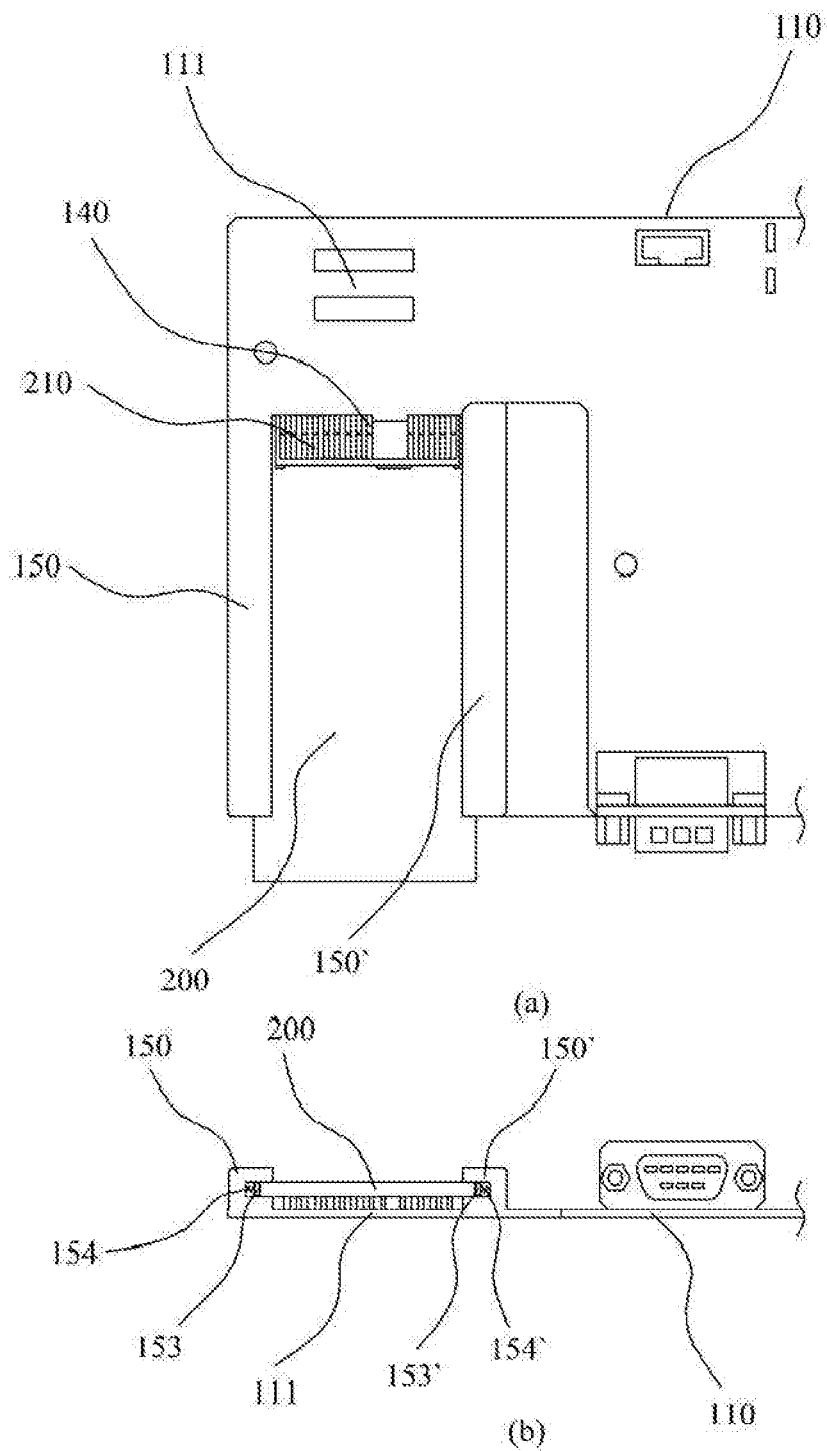
FIG. 7 is a plan view and a front view showing a state where a hard disk is inserted into a rail block unit of a main board for POS terminal according to a preferred embodiment of the present invention.
Figure 8:
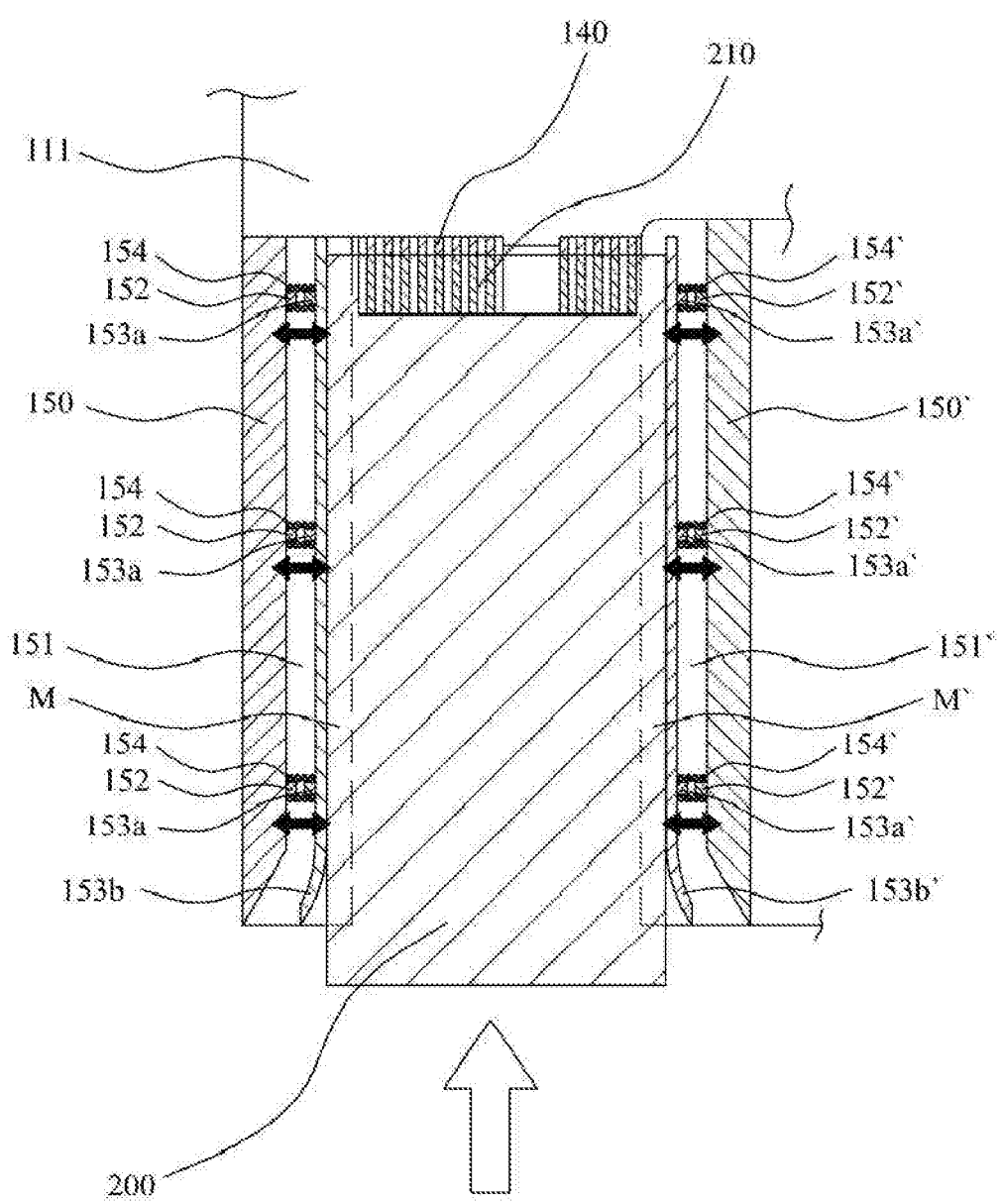
FIG. 8 is a cross-sectional view showing a cross-section of a rail block unit in which a hard disk is inserted into a rail block unit of a configuration of a main board for POS terminal according to a preferred embodiment of the present invention.

Referring to FIG. 3 or 4, a main board for POS terminal 100 according to an embodiment of the present invention includes a substrate unit 110 and a rail block unit 150 or 150'.

First, the substrate unit 110 will be described. As shown in FIG. 3, the substrate unit 110 is hardware including components such as a basic circuit and a chip set.

On the other hand, an extended substrate unit 111 protruding outward is extended and formed on one side of the substrate unit 110, and a space S is formed on a lower side of the extended substrate unit 111.

At this time, as the hard disk port unit 140 is formed in the horizontal direction on the front upper part of the extended substrate unit 111, the hard disk port unit 140 and the hard disk connection terminal 210 are coupled with each other when the hard disk 200 is located in the space S so that the hard disk 200 may be directly connected to the extended substrate unit 111 in a straight line on the horizontal plane.

Due to this, as the substrate unit 110 and the hard disk 200 are directly connected to each other without a separate cable (not shown), this prevents electrical malfunction caused by the connection of a cable (not shown), and as the transmission speed of high-speed communication increases through direct connection, communication error is reduced and stable system maintenance becomes possible.

Meanwhile, as the USB port 130 is vertically installed on the rear side upper part of the substrate unit 110, a USB terminal (not shown) of an external device may be directly connected to the USB port unit 130 without a separate USB cable (not shown).

Meanwhile, as shown in FIG. 4, a plurality of ports (for example, an input port, an output port, a communication port, and a USB port) for connecting the necessary peripheral devices are formed on the front side upper part of the substrate unit 110 as one-stage port module unit in one-stage arrangement, this improves the space efficiency inside the POS terminal (not shown), and since the thickness of the POS terminal (not shown) is formed to be thin, it is possible to realize a slim design product, and the POS terminal (not shown) may be easily installed and used without any restriction on a desk, a small-sized table, a counter, a counter desk, and the like.

Next, the rail block units 150 and 150' will be described. As shown in FIGS. 5 to 8, the rail block portions 150 and 150' include a moving paths 151 and 151', first engaging protrusions 152 and 152', pressing bar members 153 and 153' and elastic members 154 and 154' as components that guide the horizontal movement of the hard disk 200 and fix the hard disk 200 when the hard disk 200 is coupled to the hard disk port unit 140 in the process of connecting the hard disk 200 to the hard disk port unit 140, which are formed on both sides of the front surface of the extended substrate unit 111 as a pair.

The moving paths 151 and 151' are kinds of recessed grooves having a shape of "⊂" and "⊃" in the inner sides of the rail block units 150 and 150' and allow both sides of the hard disk 200 to be inserted and the hard disk 200 to be moved in a sliding manner.

The first engaging protrusions 152 and 152' are components in which a plurality of protrusions are formed on the inner surface of the moving paths 151 and 151' and are coupled with one side of elastic member 154 and 154' to be described later, thereby allowing the elastic members 154 and 154' to be fixed to the inner surface of the moving paths 151 and 151'.

The pressing bar members 153 and 153' are components formed in a long rod shape and connected to the elastic members 154 and 154' coupled with the first engaging protrusions 152 and 152' and located within the moving paths 151 and 151' to press both sides of the hard disk 200 whose movement is completed through the moving paths 151 and 151' and include second engaging protrusions 153a and 153a' and round contact surface 153b and 153b'.

The first engaging protrusions 152 and 152' are components in which a plurality of protrusions are formed on the one side of the pressing bar members 153 and 153', and are coupled with the other side of the elastic members 154 and 154' thereby allowing the pressing bar members 153 and 153' to be resiliently coupled to the moving paths 151 and 151'.

The round contact surfaces 153b and 153b' are curved surfaces bent from the end parts of the pressing bar members 153 and 153' toward the inner directions of the moving paths 151 and 151', and the round contact surfaces 153b and 153b' allow the fore-end parts of both side surfaces of the hard disk 200 to smoothly enter the curved surface without being caught by the end parts of the pressing bar members 153 and 153' in the process of both sides of the hard disk 200 entering the end parts of the moving paths 151 and 151'.

The elastic member 154 and 154' are elastic springs disposed between the first engaging protrusion 152 and 152' and the second engaging protrusion 153a and 153a' and it is preferable that the elastic members 154 and 154' maintain a tension state when the hard disk 200 is not coupled to the rail block units 150 and 150'.

Meanwhile, when the hard disk 200 is coupled to the rail block units 150 and 150', due to the compression force, the elastic members 154 and 154' are gradually shifted to the compressed state, and at this time, even if the elastic members 154 and 154' are gradually compressed, a tensile force is generated corresponding to the compressive force to return to the original tensile state, and the pressing bar members 153 and 153' press both sides of the hard disk 200 due to the tensile force, thereby enabling the hard disk 200 to be fixed to the rail block units 150 and 150'.

Therefore, by preventing the hard disk 200 from being easily detached from the hard disk port portion 140, stable mechanical coupling between the extended substrate unit 111 and the hard disk 200 becomes possible.

Optimal embodiments have been disclosed in the drawings and specification. Although specific terms have been used herein, they are used for purposes of illustration only and are not intended to limit the scope of the invention as defined in the claims or the claims. Therefore, those skilled in the art will understand that various modifications and equivalent embodiments are possible without departing from the scope of the present invention. Accordingly, the true scope of the present invention should be determined by the technical idea of the appended claims.

The invention claimed is:

1. A main board for POS terminal (100), built in a POS terminal (not shown), the main board for POS terminal comprising:
    a substrate unit (110) and
    a one-stage port module unit (120) formed on a front side upper part of the substrate unit (110) and having a plurality of ports for connecting peripheral devices in one-stage arrangement;
    wherein an extended substrate unit (111) protruding outward is extended and formed on one side of the substrate unit (110), and a hard disk port unit (140) installed in a horizontal direction is further formed on a front side upper part of the extended substrate unit (111); and
    wherein rail block units (150) and (150') for guiding a horizontal movement of the hard disk (200) and fixing the hard disk (200) when the hard disk (200) is coupled to the hard disk port unit (140) are respectively formed on both sides of a front surface of the extended substrate unit (111) in a process of connecting the hard disk (200) to the hard disk port unit (140).

2. The main board for POS terminal (100) of claim 1, wherein in each of the rail block units (150) and (150'), moving paths (150) and (151') in which parts of both sides M and M' of the hard disk (200) are inserted are formed on an inner side, and a plurality of first engaging protrusions (152) and (152') are formed on inner sides of the moving paths (151) and (151'), and a plurality of second engaging protrusions (153a) and (153a') are provided in the moving paths (151) and (151') and are formed on one sides thereof; and pressing bar members (153) and (153') where round contact surfaces (153b) and (153b') are bent in inner directions of the moving paths (151) and (151') are provided on the end part, and elastic members (154) and (154') in a tension state are provided between the first engaging protrusions (152) and (152') and the second engaging protrusions (153a) and (153a).

* * * * *